United States Patent
Maxim et al.

(10) Patent No.: US 9,048,836 B2
(45) Date of Patent: Jun. 2, 2015

(54) BODY BIAS SWITCHING FOR AN RF SWITCH

(71) Applicant: RF Micro Devices, Inc., Greensboro, NC (US)

(72) Inventors: George Maxim, Saratoga, CA (US); Dirk Robert Walter Leipold, San Jose, CA (US); Baker Scott, San Jose, CA (US)

(73) Assignee: RF Mirco Devices, Inc., Greensboro, NC (US)

( * ) Notice: Subject to any disclaimer, the term of this patent is extended or adjusted under 35 U.S.C. 154(b) by 0 days.

(21) Appl. No.: 14/449,594

(22) Filed: Aug. 1, 2014

(65) Prior Publication Data

US 2015/0035582 A1 Feb. 5, 2015

Related U.S. Application Data

(63) Continuation-in-part of application No. 14/298,829, filed on Jun. 6, 2014, and a continuation-in-part of application No. 14/298,830, filed on Jun. 6, 2014, and a continuation-in-part of application No. 14/298,834, (Continued)

(51) Int. Cl.
  *H03K 17/56* (2006.01)
  *H03K 17/30* (2006.01)
  *H03K 17/60* (2006.01)

(Continued)

(52) U.S. Cl.
  CPC ............. *H03K 17/302* (2013.01); *H03K 17/60* (2013.01); *H03K 17/687* (2013.01); *H03K 17/30* (2013.01); *H03K 17/165* (2013.01)

(58) Field of Classification Search
  USPC ......... 327/382, 389, 419, 427, 434, 436, 534, 327/574, 581, 594, 595
  See application file for complete search history.

(56) References Cited

U.S. PATENT DOCUMENTS 5,661,414 A * 8/1997 Shigehara et al. ............... 326/81
5,689,144 A * 11/1997 Williams ....................... 307/130

(Continued)

FOREIGN PATENT DOCUMENTS

EP 1184977 A2 3/2002
WO 2005117255 A1 12/2005

OTHER PUBLICATIONS

Hoppenjans, Eric E. et al., "A Vertically Integrated Tunable UHF Filter," International Microwave Symposium Digest (MTT), May 23-28, 2010, Anaheim, California, IEEE, pp. 1380-1383.

(Continued)

*Primary Examiner* — William Hernandez
(74) *Attorney, Agent, or Firm* — Withrow & Terranova, P.L.L.C.

(57) ABSTRACT

Embodiments of radio frequency (RF) switching circuitry are disclosed that include (at least) a first switch and a body switching network operably associated with the first switch. The first switch has a first control contact, a first switch contact and a first body contact. The body switching network includes a first switchable path and a second switchable path. The first switchable path is connected between the first body contact and the first control contact of the first switch. Additionally, the second switchable path is connected between the first body contact and the first switch contact. Accordingly, the first body contact is can be appropriately biased by the switchable paths without requiring a resistor network and thus there is less loading. This maintains the Q factor of the RF switching circuitry.

20 Claims, 13 Drawing Sheets

Related U.S. Application Data filed on Jun. 6, 2014, and a continuation-in-part of application No. 14/298,872, filed on Jun. 6, 2014, and a continuation-in-part of application No. 14/298,863, filed on Jun. 6, 2014, and a continuation-in-part of application No. 14/298,852, filed on Jun. 6, 2014.

(60) Provisional application No. 61/860,932, filed on Aug. 1, 2013, provisional application No. 61/909,028, filed on Nov. 26, 2013, provisional application No. 61/949,581, filed on Mar. 7, 2014, provisional application No. 61/951,844, filed on Mar. 12, 2014, provisional application No. 61/982,946, filed on Apr. 23, 2014, provisional application No. 61/982,952, filed on Apr. 23, 2014, provisional application No. 61/982,971, filed on Apr. 23, 2014, provisional application No. 61/938,884, filed on Feb. 12, 2014, provisional application No. 62/008,192, filed on Jun. 5, 2014, provisional application No. 62/031,645, filed on Jul. 31, 2014, provisional application No. 62/011,629, filed on Jun. 13, 2014.

(51) Int. Cl.
*H03K 17/687* (2006.01)
*H03K 17/16* (2006.01)

(56) References Cited

U.S. PATENT DOCUMENTS

| | | | |
|---|---|---|---|
| 5,880,620 A * | 3/1999 | Gitlin et al. | 327/534 |
| 2002/0057139 A1 | 5/2002 | Matsumura et al. | |
| 2003/0008577 A1 | 1/2003 | Quigley et al. | |
| 2005/0195063 A1 | 9/2005 | Mattson | |
| 2006/0220727 A1 * | 10/2006 | Yen | 327/534 |
| 2011/0163824 A1 | 7/2011 | Kawano | |
| 2012/0081192 A1 | 4/2012 | Hanaoka | |

OTHER PUBLICATIONS

Joshi, H. et al., "Tunable High Q Narrow-Band Triplexer," IEEE MTT-S International Microwave Symposium Digest, Jun. 7-12, 2009, Boston, MA, IEEE, pp. 1477-1480.

Kamali-Sarvestani, Reza et al., "Fabrication of High Quality Factor RF-Resonator Using Embedded Inductor and Via Capacitor," IECON 2010—36th Annual Conference on IEEE Industrial Electronics Society, Nov. 7-10, 2010, Glendale, Arizona, IEEE, pp. 2283-2287.

International Search Report and Written Opinion for PCT/US2014/030431, mailed Jun. 20, 2014, 14 pages.

* cited by examiner

US 9,048,836 B2

BODY BIAS SWITCHING FOR AN RF SWITCH

RELATED APPLICATIONS

The present application claims priority to U.S. Provisional Patent Application No. 61/860,932, filed Aug. 1, 2013; U.S. Provisional Patent Application No. 61/909,028, filed Nov. 26, 2013; U.S. Provisional Patent Application No. 61/938,884, filed Feb. 12, 2014; U.S. Provisional Patent Application No. 61/949,581, filed Mar. 7, 2014; U.S. Provisional Patent Application No. 61/951,844, filed Mar. 12, 2014; U.S. Provisional Patent Application No. 61/982,946, filed Apr. 23, 2014; U.S. Provisional Patent Application No. 61/982,952, filed Apr. 23, 2014; U.S. Provisional Patent Application No. 61/982,971, filed Apr. 23, 2014; U.S. Provisional Patent Application No. 62/008,192, filed Jun. 5, 2014; and U.S. Provisional Patent Application No. 62/031,645, filed Jul. 31, 2014.

The present application claims the benefit of and is a Continuation-in-Part of U.S. patent application Ser. No. 14/298,829, filed Jun. 6, 2014, entitled "TUNABLE RF FILTER STRUCTURE FORMED BY A MATRIX OF WEAKLY COUPLED RESONATORS;" U.S. patent application Ser. No. 14/298,830, filed Jun. 6, 2014, entitled "TUNABLE RF FILTER PATHS FOR TUNABLE RF FILTER STRUCTURES;" U.S. patent application Ser. No. 14/298,834, filed Jun. 6, 2014, entitled "HIGH QUALITY FACTOR INTERCONNECT FOR RF CIRCUITS;" U.S. patent application Ser. No. 14/298,872, filed Jun. 6, 2014, entitled "NONLINEAR CAPACITANCE LINEARIZATION;" U.S. patent application Ser. No. 14/298,863, filed Jun. 6, 2014, entitled "TUNABLE RF FILTER BASED RF COMMUNICATIONS SYSTEM;" and U.S. patent application Ser. No. 14/298,852, filed Jun. 6, 2014, entitled "MULTI-BAND INTERFERENCE OPTIMIZATION."

The present application is related to concurrently filed U.S. patent application Ser. No. 14/449,913, entitled "COOPERATIVE TUNABLE RF FILTERS;" concurrently filed U.S. patent application Ser. No. 14/450,156, entitled "ADVANCED 3D INDUCTOR STRUCTURES WITH CONFINED MAGNETIC FIELD;" concurrently filed U.S. patent application Ser. No. 14/450,028, entitled "VSWR DETECTOR FOR A TUNABLE RF FILTER STRUCTURE;" concurrently filed U.S. patent application Ser. No. 14/449,764, entitled "CALIBRATION FOR A TUNABLE RF FILTER STRUCTURE;" concurrently filed U.S. patent application Ser. No. 14/450,199, entitled "WEAKLY COUPLED TUNABLE RF RECEIVER ARCHITECTURE;" concurrently filed U.S. patent application Ser. No. 14/450,204, entitled "WEAKLY COUPLED TUNABLE RF TRANSMITTER ARCHITECTURE;" and concurrently filed U.S. patent application Ser. No. 14/450,200, entitled "INTERFERENCE REJECTION RF FILTERS."

All of the applications listed above are hereby incorporated herein by reference in their entireties.

The present application claims priority to U.S. Provisional Patent Application No. 62/011,629, filed Jun. 13, 2014.

FIELD OF THE DISCLOSURE

Embodiments of the present disclosure relate to radio frequency (RF) switching circuitry.

BACKGROUND

In order for radio frequency (RF) switching circuitry to operate correctly when an RF switch path is open and an RF switch path is closed, contacts provided by one or more switches in a switch device need to be appropriately biased. For example, if the switching device employs one or more field effect transistors (FET) as switches, the gate contact, the drain contact, the source contact and the body contact of each of the FETs has to be biased appropriately. Generally, at least one control signal is provided to control the closing and the opening of the RF switch path provided by the switch device. From this control signal, bias and control networks typically provide the appropriate biases to the contacts.

Traditional switch bias and control networks use separate resistor networks to bias the gate contact and the body contact of each of the FETs in the switch device. A principal drawback of this configuration is that there is significant loading of the RF switch path provided from the bias and control networks. This can degrade the quality (Q) factor of the switch device. This can also degrade a Q factor of RF circuitry that employs the switch device to provide switching. For example, the switch device may be employed in digital programmable capacitor arrays within a tunable RF filter structure. The loading provided from the resistor networks thus can degrade the Q factor of the tunable RF filter structure. As such, configurations of RF switching circuitry is needed that can provide less loading and thus higher Q factors.

SUMMARY

This disclosure relates generally to radio frequency (RF) switching circuitry and methods of operating the same. In one embodiment, the RF switching circuitry includes (at least) a first switch and a body switching network operably associated with the first switch. The first switch has a first control contact, a first switch contact and a first body contact. The body switching network includes a first switchable path and a second switchable path. The first switchable path is connected between the first body contact and the first control contact of the first switch. In this manner, when the first switch is open, the first body contact can be biased in the same manner as the first control contact by closing the first switchable path. Additionally, the second switchable path is connected between the first body contact and the first switch contact. In this manner, when the first switch is closed, the first body contact can be biased in the same manner as the first switch contact by closing the second switchable path. Accordingly, the first body contact is appropriately biased without requiring a resistor network, and thus results in less loading. This maintains the Q factor of the RF switching circuitry.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1:
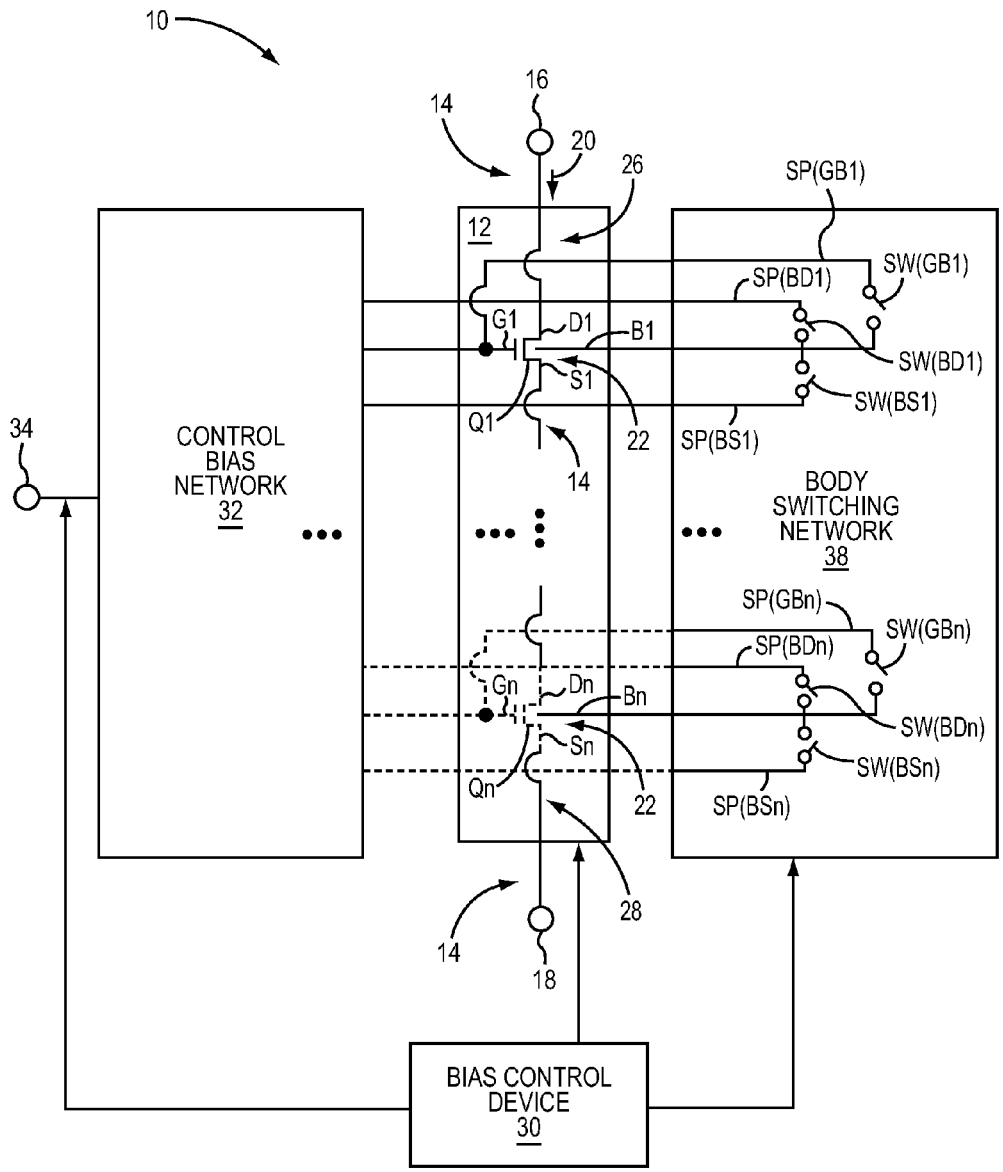
FIG. 1 illustrates one embodiment of RF switching circuitry that includes a switch device and a body switching network in accordance with this disclosure.

FIG. 1 illustrates one embodiment of radio frequency (RF) switching circuitry 10. The RF switching circuitry 10 includes a switch device 12 that defines an RF switch path 14. The RF switch path 14 is defined between an input terminal 16 and an output terminal 18. For example, the RF switch path 14 may be part of an RF path for transmitting an RF signal 20. Thus, the input terminal 16 and the output terminal 18 may be provided in the RF path. Alternatively, the RF switch path 14 may be connected in shunt with the RF path. Thus, the input terminal 16 may be connected to the RF path, while the output terminal 18 is connected to ground.

The switch device 12 is configured to be open and thus open the RF switch path 14. The switch device 12 is also configured to close and thereby close the RF switch path 14. The switch device 12 may include one or more switches 22 that include switch contacts within the RF switch path 14. Each of the switches 22 is configured to be open when the RF switch path 14 is open and is configured to be closed when the RF switch path 14 is closed. Thus, each of the switches 22 has a control terminal configured to receive a bias signal that opens and closes each of the switches 22. In this embodiment, the switch device 12 includes one or more FET(s) (referred to generically as elements Q and individually as elements $Q_1$-$Q_n$). Other embodiments of the switch device 12 may use other types of semiconductor components as switches, such as Bipolar Junction transistors (BJTs), and/or the like. In this embodiment, n is an integer indicating a number of the FETs Q in the switch device 12. The integer may be greater or equal to one (1). Thus, when the integer n of the switch device 12 is provided to equal one (1), the switch device 12 only includes the FET $Q_1$.

On the other hand, when the integer n is greater than one (1), the switch device 12 includes FETs $Q_1$-$Q_n$ coupled in series to one another to form a FET stack. Each of the FETs Q has a source, a drain, a body, and a gate. To provide electrical connections to the sources, drains, and gates, each of the FETs Q includes a source contact (referred to generically as element S and specifically as elements $S_1$-$S_n$), a drain contact (referred to generically as element D and specifically as elements $D_1$-$D_n$), and gate contacts (referred to generically as element G and specifically as elements $G_1$-$G_n$). The drain contacts D and the source contacts S are each switch contacts of the FETs Q. The gate contacts G are each control contacts of the FETs Q. In this example, each of the FETs Q also includes a body contact (referred to generically as element B and specifically as elements $B_1$-$B_n$) to connect to the body of the FETs Q.

If the integer n is greater than one (1), the FETs Q are coupled in series to form a chain so that the FETs Q are stacked with each other. In the illustrated embodiment, the drain contact $D_1$ of the FET $Q_1$ is positioned at a first end 26 of the switch device 12, and is coupled to the input terminal 16 for the RF signal 20. At a second end 28 opposite the first end 26 of the switch device 12, the FET $Q_n$ has the source contact $S_n$ that is coupled to the output terminal 18.

The switch device 12 may be formed, for example, on a silicon-on-insulator (SOI) type substrate, a silicon-on-sapphire (SOS) type substrate, a Gallium Arsenide (GaAs) type substrate, a silicon-on-other type of material substrate, or the like. Each of the FETs Q may be a complementary metal-oxide-semiconductor (CMOS) type transistor, such as a metal-oxide-semiconductor field effect transistor (MOSFET). The switch device 12 may also be a metal semiconductor field effect transistor (MESFET), a high mobility field effect transistor (HFET), or the like. SOI type substrates, SOS type substrates, and GaAs type substrates may be advantageous in some applications because of the high degree of insulation provided by their internal layers. For example, in an SOI type substrate, the switch device 12 is formed on a device layer and an insulating layer (also known as a Buried Oxide [BOX] layer) which may be provided between a handle layer and the device layer. The insulating layer is typically made from an insulating or dielectric type oxide material such as $SiO_2$, while the handle layer is typically made from a semiconductor, such as silicon (Si). The degradation in bandwidth normally associated with switch device 12 and the increased parasitic capacitances of the extra components is reduced by utilizing SOI, SOS, or GaAs type substrates and through other techniques provided in this disclosure for suppressing the loading effects of these parasitic capacitances. However, SOI type substrates, SOS type substrates, and GaAs type substrates are not required, and the particular substrate utilized to form the switch device 12 should be determined in accordance with factors considered to be important for the particular desired application, such as a required bandwidth response, distortion tolerance, cost, and the like. Note that the sources and drains between one of the switch device 12 and another one of the switch device 12 may be independent of one another or may be merged into a single drain/source having drain and source contacts D, S for each FET Q.

During an open state of the switch device 12, the FETs Q are off, and the switch device 12 presents a high impedance between the first end 26 and the second end 28. Consequently, very little, if any, current is transmitted through the switch device 12 to the output terminal 18. On the other hand, in the closed state, each of the FETs has a low impedance and thus transmits the RF signal 20 to the output terminal 18.

To switch the switch device 12 between the open state and the closed state, the RF switching circuitry includes a bias control device 30 operably associated with the switch device 12 and the FETs Q. The bias control device 30 is coupled to each of the gate contacts G, the drain contacts D, and each of the source contacts S. In this embodiment, a control bias network 32 is provided that is connected between the bias control device and the gate contacts G. Each of the gate contacts is connected to a common control node 34. The common control node 34 receives a bias voltage in order to open and close the FETs. Similarly, each of the drain contacts D and source contact S may be connected to the bias control device 30 through a common control node (not specifically shown) to receive another bias voltage from the bias control device 30 through a bias distribution network (not specifically shown).

As shown in FIG. 1, the RF switching circuitry 10 includes a body switching network 38. Different embodiments of the body switching network 38 may be provided in different locations. For example, the body switching network 38 may be provided separately and independently of any of the other components in the RF switching circuitry 10. Alternatively, the body switching network 38 may be provided in the control bias network 32. In another embodiment, the body switching network 38 is provided in the switch device 12. In still another embodiment, the body switching network 38 may be provided in the bias distribution network (not specifically shown) that is connected to the drain contacts D and the source contacts S. In still yet another embodiment, the body switching network 38 may be provided in the bias control device 30. Furthermore, alternative embodiments of the body switching network 38 may be provided as amalgamations of the above described embodiments where different portions of the body switching network 38 are provided in different portions of the RF switching circuitry 10.

As shown in FIG. 1, the body switching network 38 is operably associated with each of the FETs Q. In this embodiment, for each FET Q of the FETs Q, the body switching network 38 includes a switchable path (referred to generically as elements SP(BD) and specifically as elements SP(BD1)-SP(BDn)) that is connected between the body contact B and the drain contact D of the FET Q. Furthermore, for each FET Q of the FETs Q, the body switching network 38 includes a switchable path (referred to generically as elements SP(BS) and specifically elements SP(BS1)-SP(BSn)) that is connected between the body contact B and the source contact S of the FET Q. Finally, for each FET Q of the FETs Q, the body switching network 38 includes a switchable path (referred to generically as elements SP(GB) and specifically elements SP(GB1)-SP(GBn)) that is connected between the body contact B and the gate contact B of the FET Q. A variety of interconnect possibilities are possible for switches in the switchable paths SP(GB), SP(BS), and SP(BD).

As mentioned above, the bias control device 30 is configured to open the switch device 12 and the FETs Q and is configured to close the switch device 12 and the FETs Q. In addition, when the switch device 12 and the FETs Q are open, the bias control device 30 is configured to close each of the switchable paths SP(GB), open each of the switchable paths SP(BS) and, open each of the switchable paths SP(BD). In this manner, the body contacts B of each of the FETs Q is biased in the same manner as each of the gate contacts B when the FETs Q are open and turned off. This is because the body contact B needs to be biased low so that parasitic body-source and/or parasitic body-drain diodes are not turned on. When the switch device 12 and the FETs Q are closed, the bias control device 30 is configured to open each of the switchable paths SP(GB), close each of the switchable paths SP(BS), and close each of the switchable paths SP(BD). In this manner, the body contacts B of each of the FETs Q is biased in the same manner as each of the drain contacts D and source contacts S when the FETs Q are closed and turned on. This is because when the body contact B needs to be biased high and as close as possible to the source contacts S and drain contacts D when the switch device 12 is turned on to avoid on state switch resistance increases and experience Q factor degradation. Accordingly, the body switching network 38 allows for the body contacts B of the FETs Q to be biased appropriately without a body switching network to load the switch device 12 or with a body switching network (not shown) having much smaller loading resistances.

It should be noted that switches SW(GB) in the switchable paths SP(GB), switches SW(BS) in each of the switchable paths SP(BS), and switches SW(BD) may be provided in the switchable paths SP(GB), SP(BS), and SP(BD) so that the switchable paths SP(GB), SP(BS), and SP(BD) can be opened and closed, as described above, by the bias control device 30. The FETs Q shown in FIG. 1 are NFETs but in other embodiments the FETs Q may be PFETs. The switches SW(BS), switches SW(BS), switches SW(BD) may also be NFETs, PFETs, T-gates, complementary hybrid/combined switches, or different combinations of NFETs, PFETs, or T-gates. Furthermore, the switches SW(GB), switches SW(BS), switches SW(BD) may be the same size as the FETs Q or may be a different size, such as smaller than the FETs Q.

It should be further noted that in FETs Q, the body has parasitic junction diodes to the sources and drains. As a signal level grows, the parasitic junction diodes may exhibit leakage current that will close through the gate bias and the bias control device 30 when off and when the body contacts B are locally switched to the gate contacts G. Such body leakage currents are dependent on the signal level and may result in signal distortion. The leakage current, for example, may come from early breakdown currents in the parasitic junction diodes. If large value gate bias resistors are used in the control bias network 32, a voltage shift may appear disturbing the bias control device 30 and creating distortion. In this case, leakage current correction may be used to avoid an increase in distortion.

Figure 2:
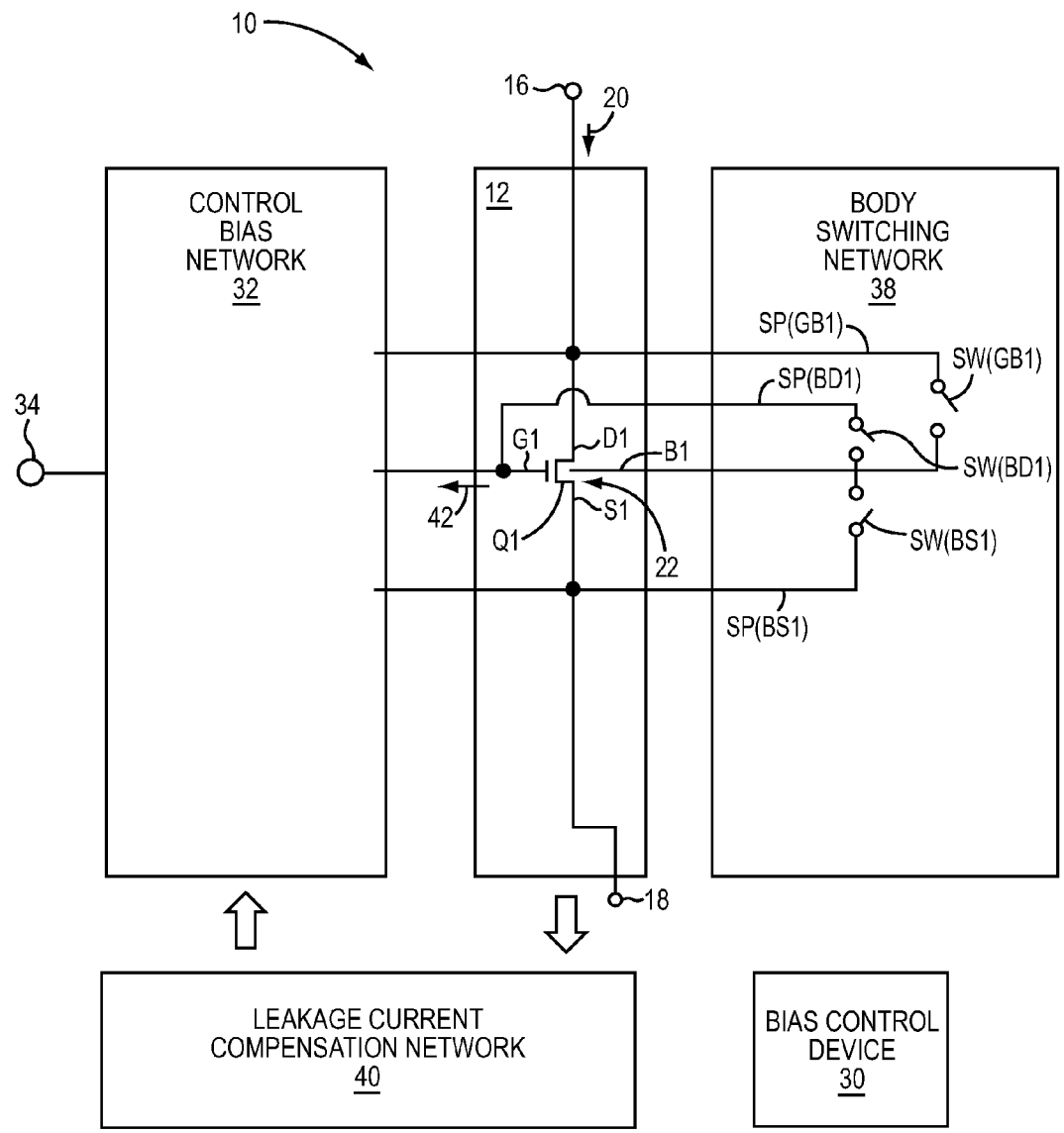
FIG. 2 is exemplary RF switching circuitry from FIG. 1 where the switch device has a single switch.

FIG. 2 illustrates an exemplary embodiment of the RF switching circuitry 10 described above in FIG. 1. However, in this embodiment, the integer n is equal to one (1), and thus the switch device 12 only includes a single one of the switches 22, which is the FET $Q_1$. Thus, the drain $D_1$ is connected to the input terminal 16 and the source $S_1$ is connected to the output terminal 18. Furthermore, the body switching network 38 only includes the switchable path SP(GB1), the switchable path SP(BS1), and the switchable path SP(BD1), which are operated by the bias control device 30 as described above with respect to FIG. 1. Additionally, the RF switching circuitry 10 shown in FIG. 2 includes a leakage current compensation circuit 40 configured to detect a leakage current 42 at the gate contact G1 and generate a leakage current compensation signal 46 that reduces the leakage current 42. Thus, the impact of the leakage current 42 on the biasing of the switch device 12 is reduced, and thus the switch device 12 has better signal performance. The leakage current compensation circuit 40 is optional but may be utilized whenever the leakage current 42 can cause excessive distortion. One of the advantages of the leakage current compensation circuit 40 may be to reduce or prevent the leakage current 42 from flowing into high value resistors in the control bias network 32 by directing the leakage current 42 into the leakage current compensation circuit 40.

Figure 3:
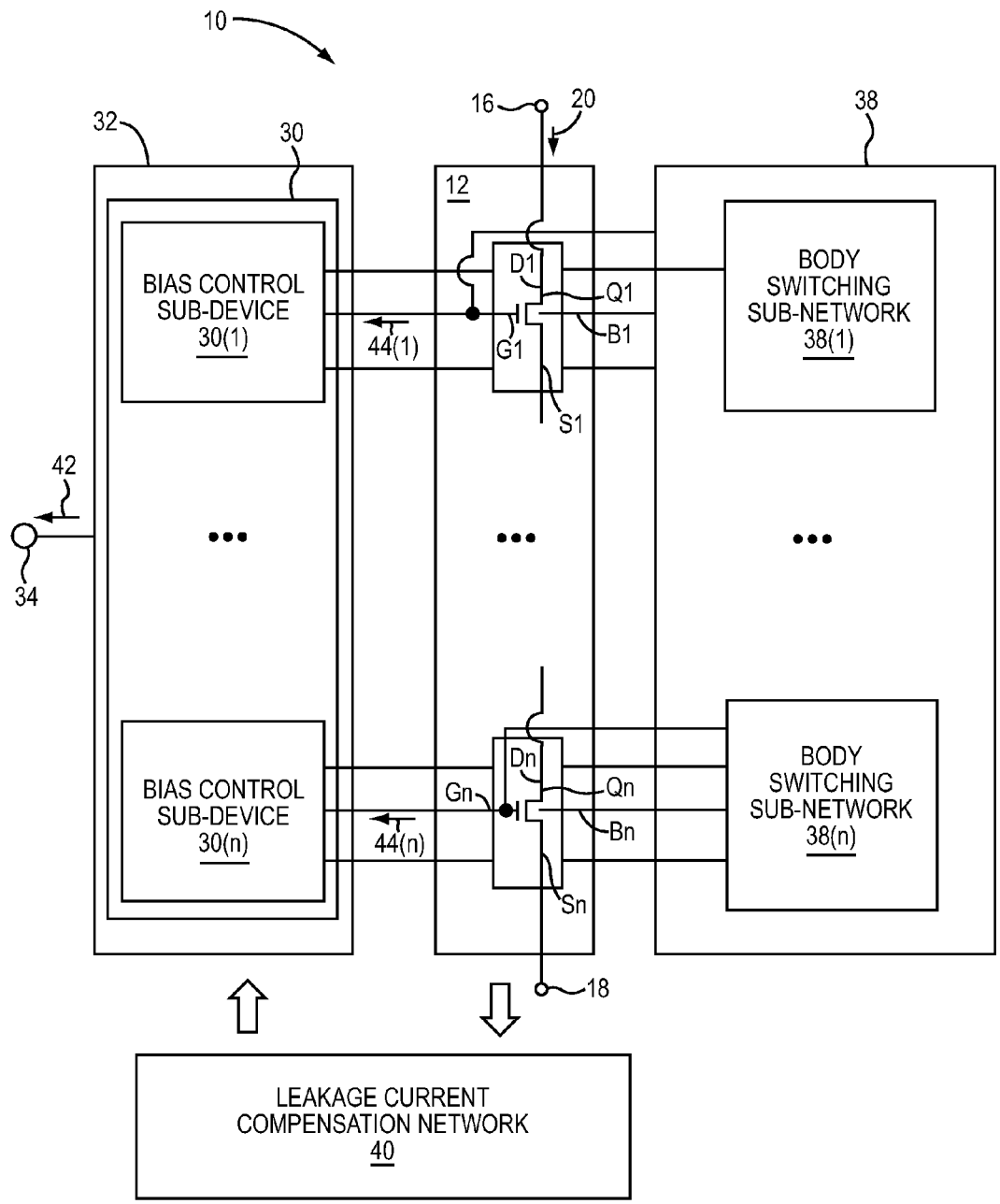
FIG. 3 is exemplary RF switching circuitry from FIG. 1 where the switch device has a stack of switches.

FIG. 3 illustrates another exemplary embodiment of the RF switching circuitry 10. In this embodiment, the bias control device 30 is provided in the control bias network 32. In this embodiment, the integer n is greater than one (1) and thus the switch device 12 includes the FETs $Q_1$-$Q_n$. Furthermore, the bias control device 30 includes bias control sub-device 30(1)-30(n), wherein each one of the bias control sub-device 30(1)-30(n) operates a particular set of the switchable paths SP(GB), SP(BS), and SP(BD) associated with its respective FET Q. For example, the bias control sub-device 30(1) opens and closes the FET $Q_1$ and the switchable paths switchable paths SP(GB1), SP(BS1), and SP(BD1), as described above with respect to FIG. 1. The bias control sub-device 30(n) opens and closes the FET $Q_n$, and the switchable paths SP(GBn), SP(BSn), and SP(BDn), as described above with respect to FIG. 1.

In addition, the body switching network 38 includes body switching subnetworks 38(1)-38(n). Each one of the body switching subnetworks 38(1)-38(n) includes a particular set of the switchable paths SP(GB), SP(BS), and SP(BD) (shown in FIG. 1) associated with its respective FET Q. For example, the body switching subnetwork 38(1) includes the switchable paths SP(GB1), SP(BS1), and SP(BD1) (shown in FIG. 1). The body switching subnetwork 38(n) includes switchable paths SP(GBn), SP(BSn), and SP(BDn) (shown in FIG. 1).

Additionally, the RF switching circuitry 10 includes another embodiment of the leakage current compensation circuit 40. In this embodiment, the leakage current compensation circuit 40 is configured to detect the leakage current 42, which includes leakage sub-currents 44(1)-44(n) from each of the gate contacts G. Thus, the leakage current compensation circuit 40 is configured to detect each of the leakage sub-currents 44(1)-44(n) at each of the gate contacts G. Furthermore, the leakage current compensation circuit 40 is configured to generate a leakage current compensation output 48 that reduces the leakage current 42. The leakage current compensation output 48 may include a single leakage current compensation signal injected at the common control node 34 to compensate for the leakage current 42. Alternatively, the leakage current compensation output 48 includes various leakage current compensation signals that are injected into each of the gate contacts G or at other nodes in the bias control sub-devices 30(1)-30(n) that prevent the leakage current 42 from flowing into the high value resistors.

Figure 4A:
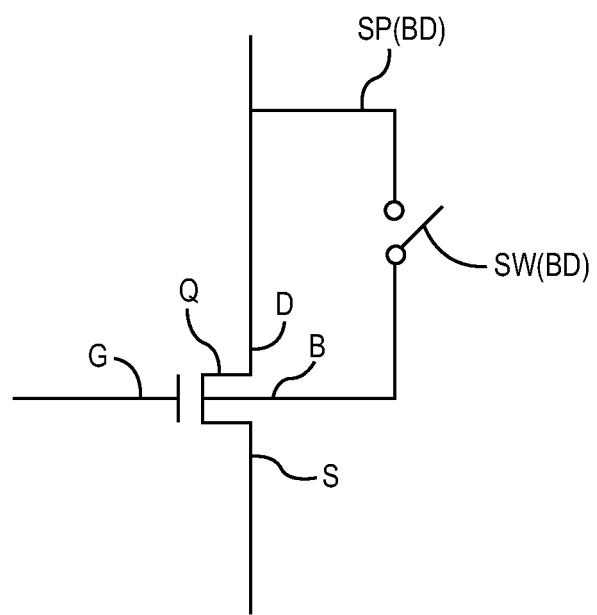
FIGS. 4A and 4B illustrate exemplary switchable paths that may be provided in the body switching network of FIGS. 2 and 3 and that connect a body contact of a switch to switch contact(s) of the switch in a RF switch path provided by the switch device.
Figure 4B:
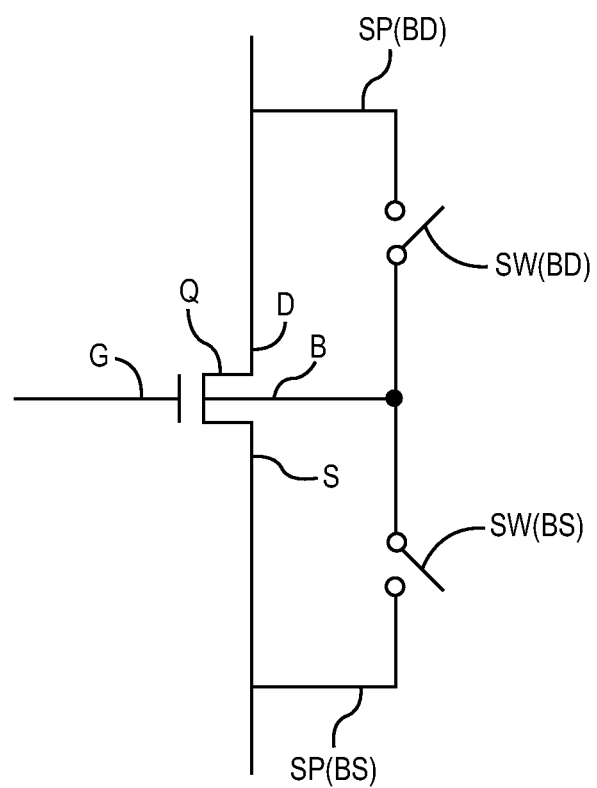

FIGS. 4A and 4B illustrate exemplary switchable paths SP(BD), SP(BS) that may be provided in the body switching network of FIGS. 2 and 3 and that connect the body contact B of one of the FETs Q to the drain contact D and/or the source contact S of the FET Q. In the embodiment shown in FIG. 3, the arrangement shown in FIGS. 4A and 4B may be provided in each one of the body switching subnetworks 38(1)-38(n).

Referring now specifically to FIG. 4A, only the exemplary switchable path SP(BD) connected between the body contact B and the drain contact D of the FET Q. The switchable path SP(BD) includes the switch SW(BD). The bias control device 30 (shown in FIG. 1) is configured to turn on (i.e., close) the switch SW(BD) when the FET Q is turned on (i.e., closed). The bias control device 30 (shown in FIG. 1) is configured to turn off (i.e., open) the switch SW(BD) when the FET Q is turned off (i.e., opened). In other embodiments, only the switchable path SP(BS) (shown in FIG. 1) is provided and not the switchable path SP(BD).

Referring now specifically to FIG. 4B, the exemplary switchable path SP(BD) connected between the body contact B and the drain contact D of the FET Q and the switchable path SP(BS) is connected between the body contact B and the source contact S of the FET(Q). The switchable path SP(BD) includes the switch SW(BD) while the switchable path SP(BS) includes the switch (BS). The bias control device 30 (shown in FIG. 1) is configured to turn on (i.e., close) the switch SW(BD) when the FET Q is turned on (i.e., closed). Also, the bias control device 30 (shown in FIG. 1) is configured to turn on (i.e., close) the switch SW(BS) when the FET Q is turned on (i.e., closed). The bias control device 30 (shown in FIG. 1) is configured to turn off (i.e., open) the switch SW(BD) when the FET Q is turned off (i.e., opened). Also, the bias control device 30 (shown in FIG. 1) is configured to turn off (i.e., open) the switch SW(BS) when the FET Q is turned off (i.e., opened). Control signals for the switches SW(BD), SW(BS), and SW(GB) may be derived from global control signals from the bias control device 30 for the FETs Q. In one embodiment, they can be derived from local drain and source potentials provided by the bias control device 30.

Figure 5A:
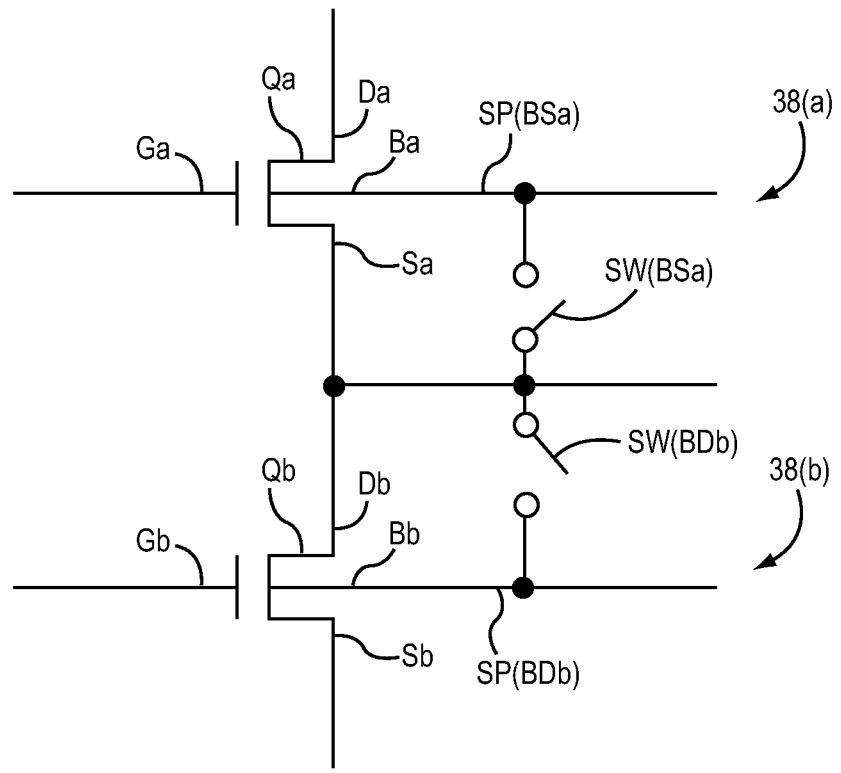
FIGS. 5A and 5B illustrate exemplary switchable paths that may be provided in the body switching network of FIG. 3 and that connect a body contact of stacked switches to switch contacts of the stacked switches in an RF switch path provided by the switch device.
Figure 5B:
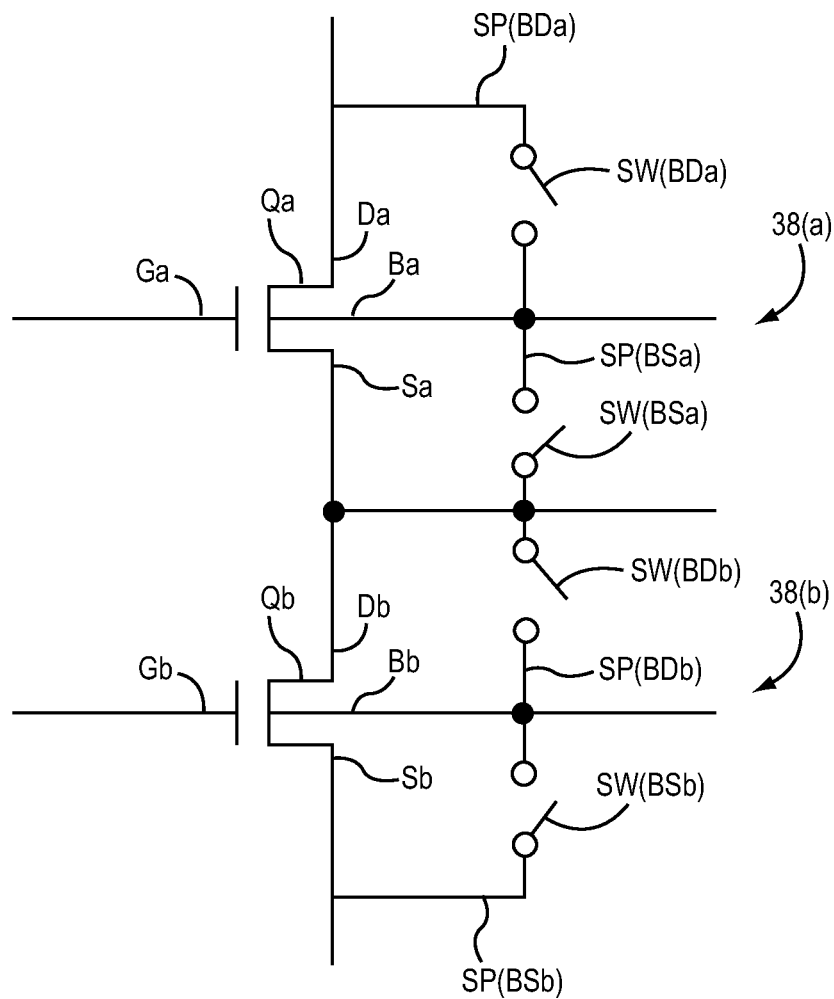

FIGS. 5A and 5B illustrate exemplary switchable paths that may be provided in adjacent pairs of the body switching subnetworks 38(1)-38(n) for adjacent pairs of the FETs $Q_1$-$Q_n$ that are stacked with each other. More specifically, the FET $Q_a$ is shown where an integer a may be any integer from 1 to n and the FET $Q_b$ where the integer b may be either a+1 or a−1.

Referring now specifically to FIG. 5A, only the exemplary switchable path SP(BSa) is connected between the body contact $B_a$ and the source contact $S_a$ of the FET $Q_a$. The switchable path SP(BSa) is in the body switching subnetwork 38(a). The switchable path SP(BSa) includes the switch SW(BSa). The bias control device 30 (shown in FIG. 1) is configured to turn on (i.e., close) the switch SW(BSa) when the FET $Q_a$ is turned on (i.e., closed). The bias control device 30 (shown in FIG. 1) is configured to turn off (i.e., open) the switch SW(BSa) when the FET $Q_a$ is turned off (i.e., opened).

As shown in FIG. 5A, only the exemplary switchable path SP(BDb) is connected between the body contact $B_b$ and the drain contact $D_b$ of the FET $Q_b$. The switchable path SP(BDb) is in the body switching subnetwork 38(b). The switchable path SP(BDb) includes the switch SW(BDb). The bias control device 30 (shown in FIG. 1) is configured to turn on (i.e., close) the switch SW(BDb) when the FET $Q_b$ is turned on (i.e., closed). The bias control device 30 (shown in FIG. 1) is configured to turn off (i.e., open) the switch SW(BDb) when the FET $Q_b$ is turned off (i.e., opened).

Referring now specifically to FIG. 5B, the exemplary switchable path SP(BSa) is connected between the body contact $B_a$ and the source contact $S_a$ of the FET $Q_a$. Also, the exemplary switchable path SP(BDa) is connected between the body contact $B_a$ and the drain contact $D_a$ of the FET $Q_a$. The switchable path SP(BSa) and the switchable path SP(BDa) are in the body switching subnetwork 38(a). The switchable path SP(BSa) includes the switch SW(BSa) while the switchable path SP(BDa) includes the switch SW(BDa). The bias control device 30 (shown in FIG. 1) is configured to turn on (i.e., close) the switch SW(BSa) and the switch (BDa) when the FET $Q_a$ is turned on (i.e., closed). The bias control device 30 (shown in FIG. 1) is configured to turn off (i.e., open) the switch SW(BSa) and the switch SW(BDa) when the FET $Q_a$ is turned off (i.e., opened).

As shown in FIG. 5B, the exemplary switchable path SP(BSb) is connected between the body contact $B_b$ and the source contact $S_b$ of the FET $Q_b$. Also, the exemplary switchable path SP(BDb) is connected between the body contact $B_b$ and the drain contact $D_b$ of the FET $Q_b$. The switchable path SP(BSb) and the switchable path SP(BDb) are in the body switching subnetwork 38(b). The switchable path SP(BSb) includes the switch SW(BSb) while the switchable path SP(BDb) includes the switch SW(BDb). Body switching can be performed for each of the switches SW(BDa), SW(BDb), SW(BSa), SW(BSb) individually or in groups. The bias control device 30 (shown in FIG. 1) is configured to turn on (i.e., close) the switch SW(BSb) and the switch (BDb) when the FET $Q_b$ is turned on (i.e., closed). The bias control device 30 (shown in FIG. 1) is configured to turn off (i.e., open) the switch SW(BSb) and the switch SW(BDb) when the FET $Q_b$ is turned off (i.e, opened).

Figure 6A:
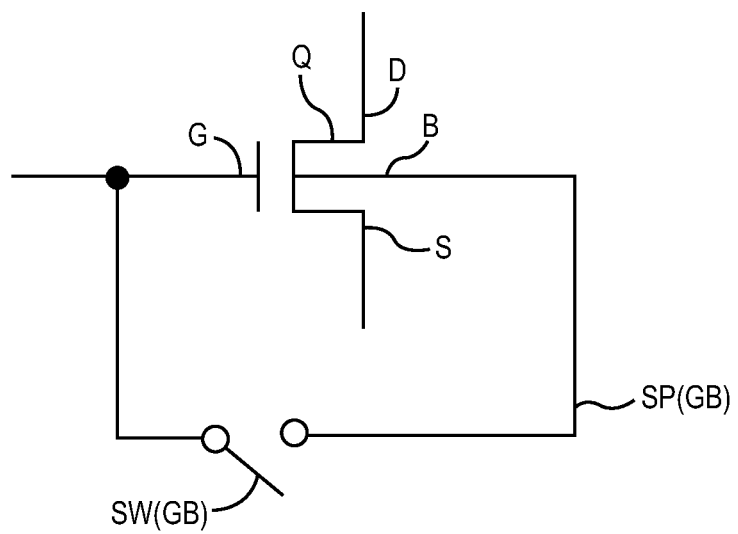
FIGS. 6A and 6B illustrate exemplary switchable paths that may be provided in the body switching network of FIGS. 2 and 3 and that connect a body contact of a switch to a control contact of the switch.
Figure 6B:
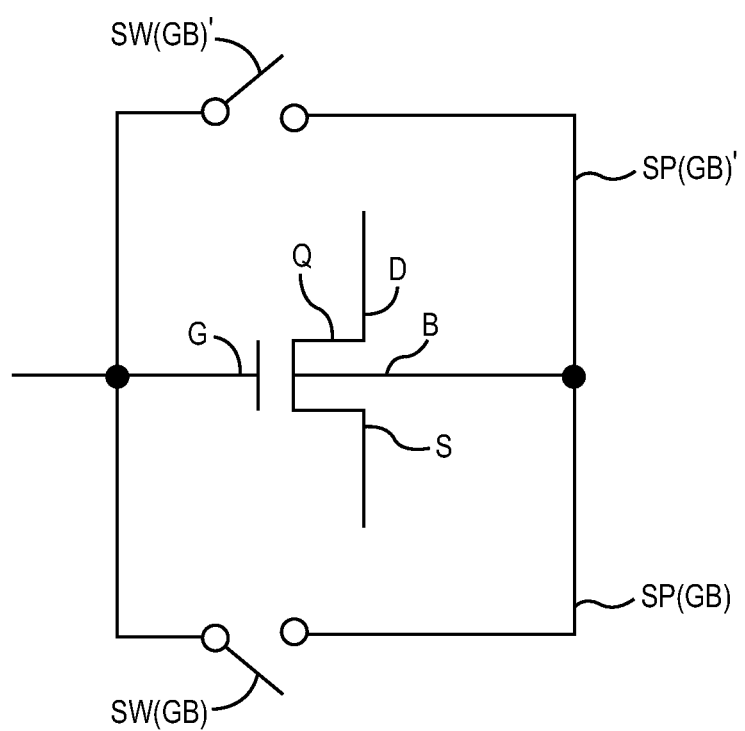

FIGS. 6A and 6B illustrate exemplary switchable paths SP(GB), SP(GB)' that may be provided in the body switching network of FIGS. 2 and 3 and that connect the body contact B of one of the FETs Q to the gate contact B of the FET Q. In the embodiment shown in FIG. 3, the arrangement shown in FIGS. 6A and 6B may be provided in each one of the body switching subnetworks 38(1)-38(n).

Referring now specifically to FIG. 6A, only the exemplary switchable path SP(GB) is connected between the body contact B and the gate contact G of the FET Q. The switchable path SP(GB) includes the switch SW(GB). The bias control device 30 (shown in FIG. 1) is configured to turn off (i.e., open) the switch SW(GB) when the FET Q is turned on (i.e., closed). The bias control device 30 (shown in FIG. 1) is configured to turn on (i.e., close) the switch SW(GB) when the FET Q is turned off (i.e, opened). If control for the switch SW(GB) is generated from one side of FET Q, the circuit may have a certain asymmetry.

Referring now specifically to FIG. 6B, the exemplary switchable path SP(GB) is connected between the body contact B and the gate contact D of the FET Q and the switchable path SP(GB)' is also connected between the body contact B and the gate contact G of the FET Q. The switchable path SP(GB) includes the switch SW(GB), while the switchable path SP(GB) includes the switch (GB)'. The bias control device 30 (shown in FIG. 1) is configured to turn off (i.e., open) the switch SW(GB) when the FET Q is turned on (i.e., closed). Also, the bias control device 30 (shown in FIG. 1) is configured to turn off (i.e., open) the switch SW(GB)' when the FET Q is turned on (i.e., closed).

Figure 7:
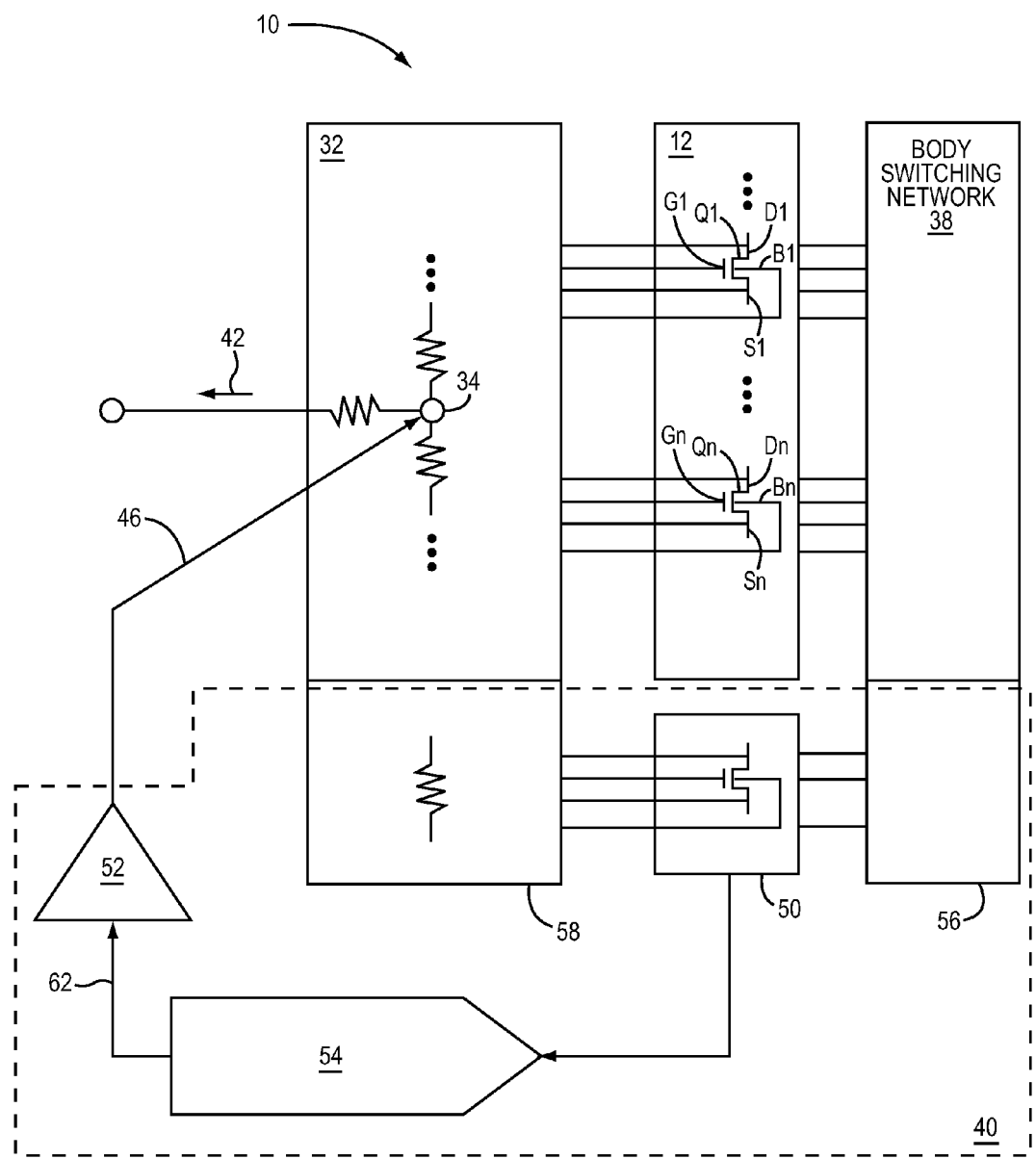
FIG. 7 illustrates the RF switching circuitry shown in FIG. 3 that includes one embodiment of a leakage current compensation circuit that injects a single leakage current compensation signal to correct for a leakage current in the switch device.

FIG. 7 illustrates the RF switching circuitry 10 shown in FIG. 3 that includes one embodiment of the leakage current compensation circuit 40 that injects the single leakage current compensation signal 46 to correct for the leakage current 42 in the switch device 12. The leakage current compensation circuit 40 shown in FIG. 7 includes a replica switch device 50, a current detector 54, an (optional) replica body switching network 56, a replica control bias network 58 and a current generator 52. Since the leakage current 42 is important only when the switch device 12 is open (i.e., turned off), a static body connection can be used for the replica switch device 50. The replica switch device 50 mimics the operation of the switch device 12 with the replica body switching network 56 (mimics the body switching network 38), and the replica control bias network 58 (mimics the control bias network 32). In this manner, the replica switch device 50 tracks closely the voltage levels in the switch device 12. As such, the replica switch device 50 is configured to generate a mimicking body current 60 that mimics the leakage current 42. The mimicking body current 60 matches up to a fixed multiplication factor of the signal dependent leakage current 44 in the switch device 12. The current detector 54 detects the mimicking body current 60 and generates a current signal 62 that indicates a current level of the mimicking body current 60. Thus, the current detector 54 detects the leakage subcurrents from the gate contacts G of each of the FETs Q. The current generator 52 in this embodiment is an amplifier. The current generator 52 generates the leakage current compensation signal 46. The current generator 52 has a gain related to a negative of the inverse of the fixed multiplication factor and thus matches the leakage current 42 of the switch device 12. In this embodiment, the leakage current compensation signal 46 is injected into the common control node 34. By connecting the current generator 52 to the control bias network 32, the high value resistance of the control bias network, voltage shifts are minimized. Thus, the leakage current compensation circuit 40 provides body current neutralization and compensation.

Figure 8:
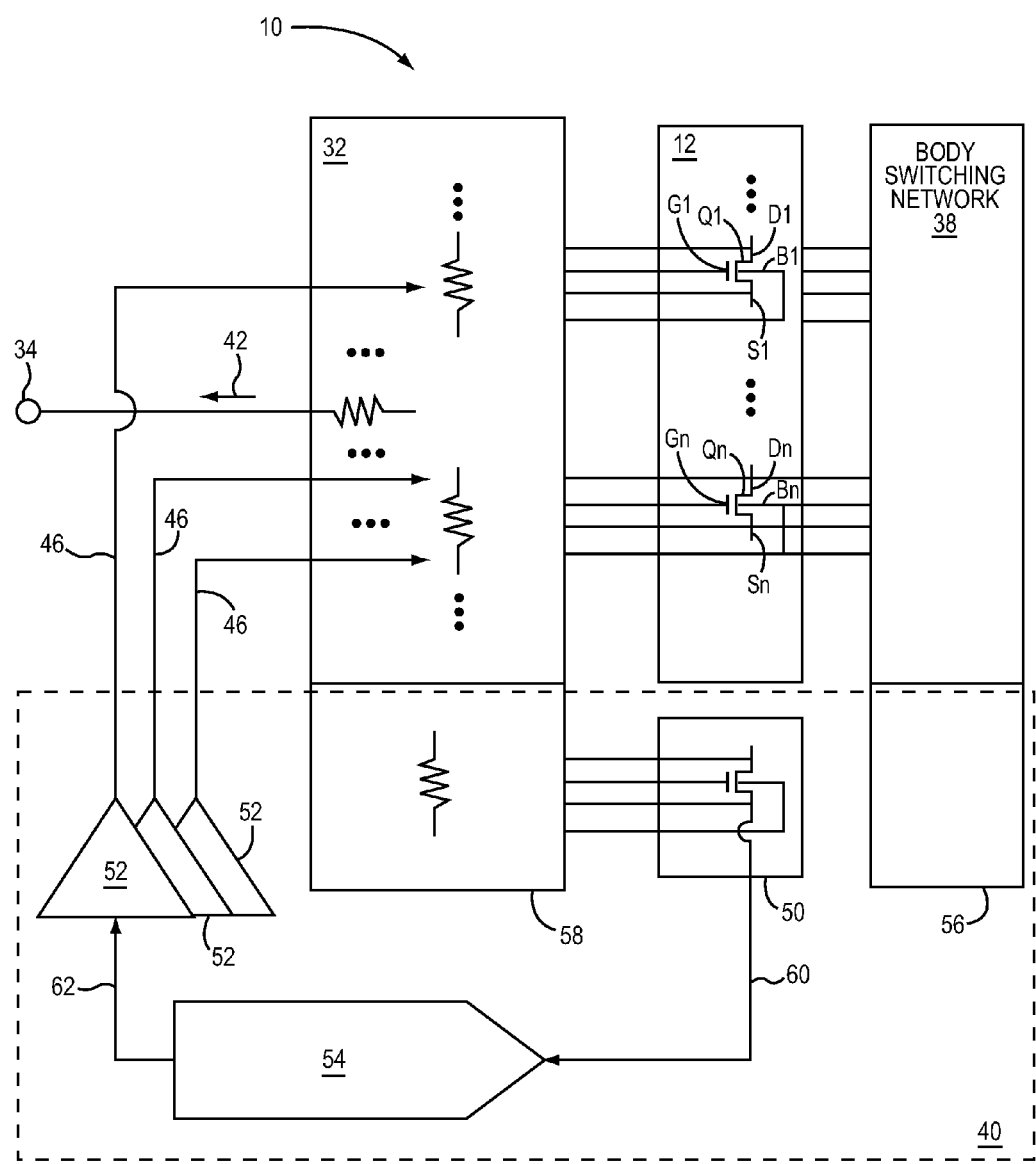
FIG. 8 illustrates the RF switching circuitry shown in FIG. 3 that includes another embodiment of a leakage current compensation circuit that injects multiple leakage current compensation signals to correct for a leakage current in the switch device.

FIG. 8 illustrates the RF switching circuitry 10 shown in FIG. 3 that includes another embodiment of the leakage current compensation circuit 40 that injects the various leakage current compensation signals 46 to correct for the leakage current 42 in the switch device 12. In particular, there are n number of leakage current compensation signals 46, where each leakage current compensation signal 46 is injected into one of the gate contacts G of one of the FETs Q or to another node in the control bias network 32 before large value resistors. In this embodiment, there are a plurality of current generators 52, which are each current amplifiers. Each of the current generators 52 is configured to generate one of the leakage current compensation signals 46. Also, gains of the current generators 52 are divided by n when compared with the gain of the current generator 52 shown in FIG. 7. In this manner, the combination of the leakage current compensation signals 46 match and neutralize the leakage current 42. Leakage current compensation circuit 40 provides body current neutralization and compensation.

In most embodiments of the switch device 12 shown in FIG. 3 where the FETs Q are stacked, the FETs Q are operated similarly. In some cases, by design or due to unintended parasitics, the different FETs Q in the stack may be biased at different voltage levels, which result in different leakage subcurrents. If skew is known, scaling factors of the leakage current compensation signals 46 can be different and designed to compensate for specific ones of the leakage subcurrents of each of the FETs Q.

Figure 9A:
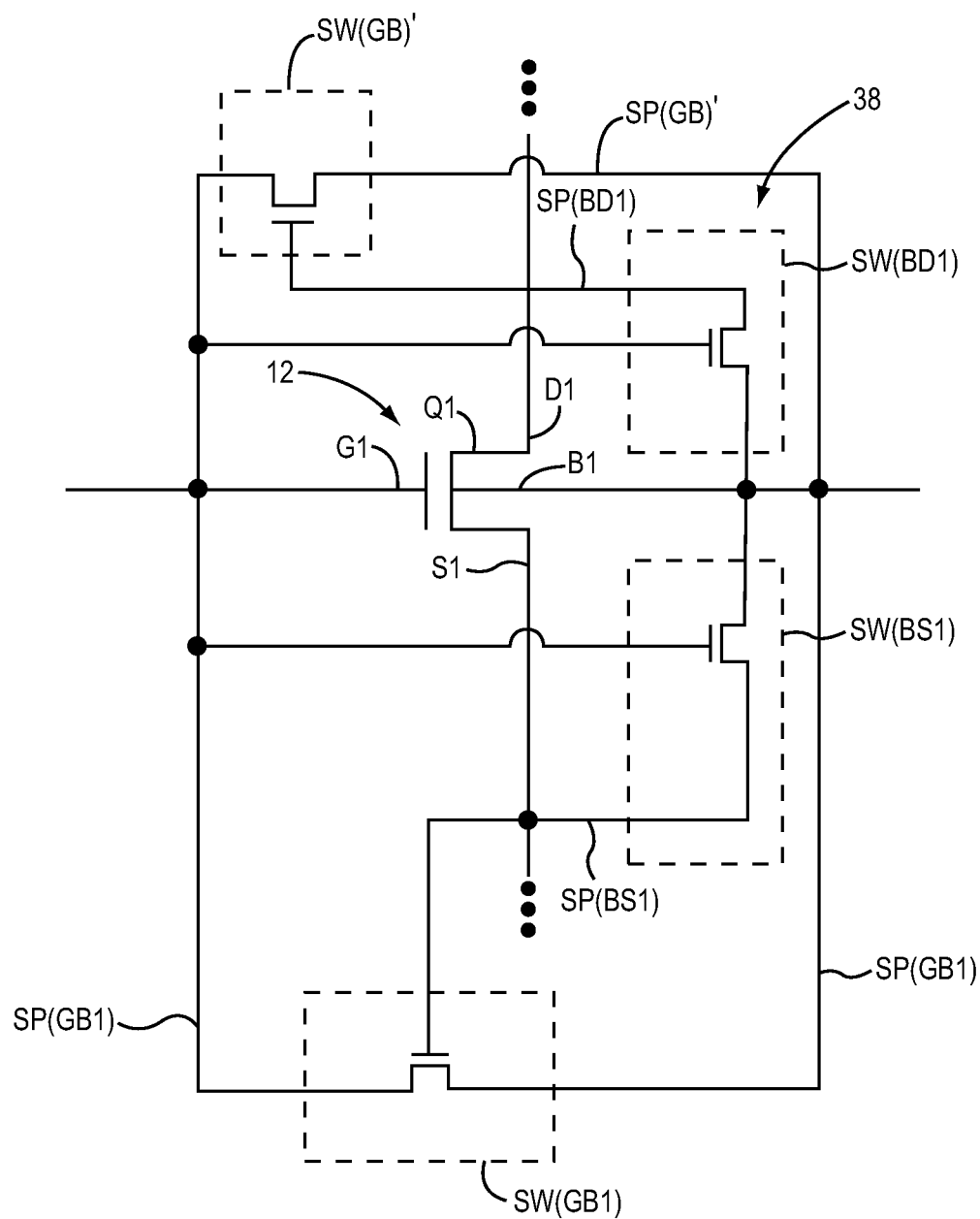
FIGS. 9A-9C illustrate an embodiment of a switch device and switchable paths in the RF switching circuitry shown in FIG. 2 along with equivalent circuits when the switchable paths are closed and opened.

FIG. 9A illustrates one embodiment of the switch device 12 shown in FIG. 2 that includes the single FET $Q_1$. Also shown are embodiments of the switchable paths SP(BD1), SP(BS1), and SP(GB1) and the switches SW(BD1), SW(BS1), and SW(GB1). In addition, the switchable path SP(GB)' is provided with an embodiment of switch SW(GB)'. In this embodiment, the switches SW(BD1), SW(BS1), SW(GB1) and SW(GB)' are each provided as FETs. A drain contact and source contact of each of the switches SW(BD1), SW(BS1), SW(GB1) and SW(GB)' are connected within their respect switchable paths SP(BD1), SP(BS1), SP(GB1) and SP(GB)'. A gate contact of each of the switches SW(BD1), SW(BS1) are connected to the gate contact $G_1$ of the FET Q1. A gate contact of each of the switches SW(GB1) and SW(GB)' are connected to the drain contact $D_1$ and the source contact $S_1$ of the FET $Q_1$, respectively. Accordingly, when the FET $Q_1$ is closed (i.e., turned on), the switches SW(BD1), SW(BS1) are turned on (i.e. closed) by the biasing provided to the gate contact $G_1$ provided by the bias control device 30 (shown in FIG. 1). When the FET $Q_1$ is open (i.e., turned off), the switches SW(GD1), SW(GD)' are turned on (i.e., closed) by the biasing provided to the drain contact $D_1$ and the source contact $S_1$ provided by the bias control device 30 (shown in FIG. 1).

Figure 9B:
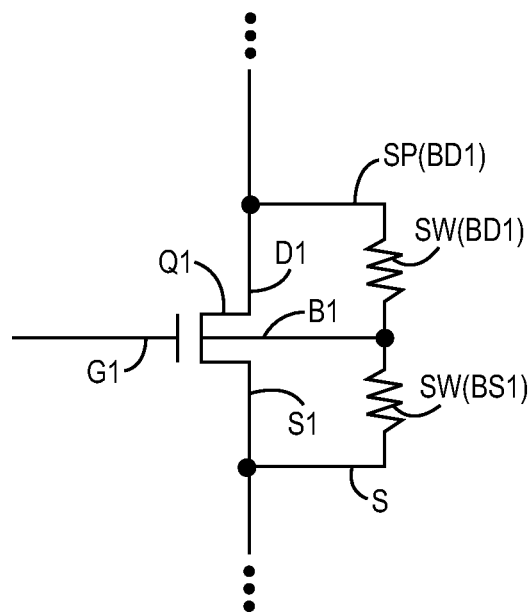

FIG. 9B illustrates an embodiment of an equivalent circuit of the switch device 12 shown in FIG. 9A when the FET $Q_1$ is turned on and closed. The switch SW(BD1) and the switch SW(BS1) in the switchable paths SP(BD1), SP(BS1) are represented by resistors and are turned on and closed. These resistances are thus provided to the body contact $B_1$.

Figure 9C:
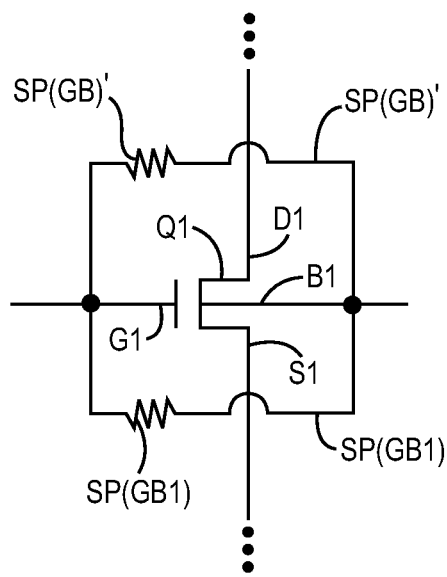

FIG. 9C illustrates an embodiment of an equivalent circuit of the switch device 12 shown in FIG. 9A when the FET $Q_1$ is turned off and open. The switch SW(GB1) and the switch SW(GB)' in the switchable paths SP(GB1), SP(GB)' are represented by resistors and are turned on and closed. These resistances are thus provided to the body contact $B_1$. Other body switching networks are possible to connect the body contact $B_1$ dynamically to the drain contact $D_1$ and/or the source contact $S_1$ and the gate contact $G_1$ and fall within the scope of this disclosure.

Those skilled in the art will recognize improvements and modification to the preferred embodiments of the present disclosure. All such improvements and modifications are considered within the scope of the concepts disclosed herein and the claims that follow.

What is claimed is:

1. Radio frequency (RF) switching circuitry comprising:
    a first switch comprising a first control contact, a first switch contact and a first body contact;
    a body switching network operably associated with the first switch, the body switching network comprising:
        a first switchable path connected between the first body contact and the first control contact;
        a second switchable path connected between the first body contact and the first switch contact;
    a bias control device configured to:
        open the first switch;
        close the first switch;
        close the first switchable path when the first switch is open; and
        open the first switchable path when the first switch is closed.

2. The RF switching circuitry of claim 1 wherein the bias control device is further configured to:
    open the second switchable path when the first switch is open;
    close the second switchable path when the first switch is closed.

3. The RF switching circuitry of claim 1 wherein the first switch is a first field effect transistor (FET) and the first control contact is a first gate contact of the first FET.

4. The RF switching circuitry of claim 3 wherein the first switch contact is a drain contact of the first FET.

5. The RF switching circuitry of claim 3 wherein the first switch contact is a source contact of the first FET.

6. The RF switching circuitry of claim 1 further comprising a switch device comprising the first switch and providing an RF switch path, wherein the first switch contact is provided in the RF switch path.

7. The RF switching circuitry of claim 6 wherein:
    the first switch further comprises a second switch contact provided in the RF switch path;
    the body switching network comprising a third switchable contact path connected between the first body contact and the second switch contact.

8. The RF switching circuitry of claim 7 the bias control device further configured to:
    open the second switchable path when the first switch is open;
    close the second switchable path when the first switch is closed;
    open the third switchable path when the first switch is open;
    close the third switchable path when the first switch is closed.

9. The RF switching circuitry of claim 1 further comprising a third switchable path connected between the first control contact and the first body contact.

10. The RF switching circuitry of claim 9 the bias control device further configured to:
    open the second switchable path when the first switch is open;
    close the second switchable path when the first switch is closed;
    open the third switchable path when the first switch is closed;
    close the third switchable path when the first switch is open.

11. The RF switching circuitry of claim 1 further comprising a leakage current compensation circuit configured to detect a leakage current at the first control contact and generate a leakage current compensation signal that reduces the leakage current.

12. The RF switching circuitry of claim 1 further comprising:
    a switch device that defines an RF switch path, the switch device comprising:
        the first switch, wherein the first switch contact is in the RF switch path;
        a second switch stacked with the first switch comprising a second switch contact, a second body contact, and a second control contact, wherein the second switch contact is in the RF switch path;
    the body switching network further comprising:
        a third switchable path connected between the second body contact and the second control contact;
        a fourth switchable path connected between the second body contact and the second switch contact.

13. The RF switching circuitry of claim 12 wherein:
    the switch device further comprises:
        a third switch stacked with the first switch and the second switch, wherein the third switch comprises a third switch contact, a third body contact, and a third control contact, wherein the third switch contact is in the RF switch path;
    the body switching network further comprising:
        a fifth switchable path connected between the third body contact and the third control contact;
        a sixth switchable path connected between the third body contact and the third switch contact.

14. The RF switching circuitry of claim 12 wherein:
    the first switch is a first FET, the first control contact is a first gate contact of the first FET and the first switch contact is a first drain contact of the first FET;
    the second switch is a second FET, the second control contact is a second gate contact of the second FET and the second switch contact is a second drain contact of the second FET.

15. The RF switching circuitry of claim 12 wherein:
    the first switch is a first FET, the first control contact is a first gate contact of the first FET and the first switch contact is a first drain contact of the first FET;
    the second switch is a second FET, the second control contact is a second gate contact of the second FET and the second switch contact is a first source contact of the second FET.

16. The RF switching circuitry of claim 12 further comprising:
    a leakage current compensation circuit configured to detect a leakage current at the first control contact and the second control contact and generate one or more leakage current compensation signals that reduce the leakage current.

17. The RF switching circuitry of claim 16 wherein the leakage current compensation circuit comprises a replica switch device, a current detector, and a current generator that generates the one or more leakage current compensation signals as one leakage current compensation signal.

18. The RF switching circuitry of claim 16 wherein the leakage current compensation circuit comprises a replica switch device, a current detector, and a first current generator that generates a first leakage current compensation signal that is injected into the first control contact and a second current generator that generates a second leakage current compensation signal that is injected into the second control contact so that the one or more leakage current compensation signals comprise the first leakage current compensation signal and the second leakage current compensation signal.

19. A method comprising:
opening a first switch;
closing the first switch;
closing a first switchable path when the first switch is open, wherein the first switchable path is connected between a first body contact of the first switch and a first control contact of the first switch;
opening the first switchable contact path when the first switch is closed;
opening a second switchable path when the first switch is open, wherein the second switchable path is connected between the first body contact of the first switch and a first switch contact of the first switch; and
closing the second switchable path when the first switch is closed.

20. Radio frequency (RF) switching circuitry comprising:
a first switch comprising a first control contact, a first switch contact and a first body contact;
a body switching network operably associated with the first switch, the body switching network comprising:
a first switchable path connected between the first body contact and the first control contact;
a second switchable path connected between the first body contact and the first switch contact;
a bias control device configured to:
open the first switch;
close the first switch;
open the second switchable path when the first switch is open;
close the second switchable path when the first switch is closed.

* * * * *

UNITED STATES PATENT AND TRADEMARK OFFICE
CERTIFICATE OF CORRECTION

PATENT NO. : 9,048,836 B2  
APPLICATION NO. : 14/449594  
DATED : June 2, 2015  
INVENTOR(S) : George Maxim, Dirk Robert Walter Leipold and Baker Scott It is certified that error appears in the above-identified patent and that said Letters Patent is hereby corrected as shown below:

In the Claims:

In column 11, lines 58-59, Claim 7, replace "switchable contact path" with --switchable path--.

Signed and Sealed this
Twentieth Day of October, 2015

Michelle K. Lee
*Director of the United States Patent and Trademark Office*